(12) United States Patent
Zabler et al.

(10) Patent No.: US 6,289,738 B1
(45) Date of Patent: *Sep. 18, 2001

(54) TESTABLE MEMBRANE SENSOR WITH TWO FULL BRIDGES

(75) Inventors: Erich Zabler, Stutensee; Herbert Keller, Wiernsheim; Joerg Wolf, Karlsruhe, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/806,256

(22) PCT Filed: Jul. 6, 1996

(86) PCT No.: PCT/DE96/01211

§ 371 Date: Feb. 21, 1997

§ 102(e) Date: Feb. 21, 1997

(87) PCT Pub. No.: WO97/05464

PCT Pub. Date: Feb. 13, 1997

(30) Foreign Application Priority Data

Jul. 28, 1995 (DE) .............................. 195 27 687

(51) Int. Cl.[7] ...................................................... G01L 7/00
(52) U.S. Cl. ................................................................ 73/726
(58) Field of Search ........................... 73/763, 765, 767, 73/774, 725–727, 708, 726

(56) References Cited

U.S. PATENT DOCUMENTS

| | | | |
|---|---|---|---|
| 3,358,511 | * 12/1967 | Bargen | 73/727 |
| 4,576,052 | * 3/1986 | Sugiyama | 73/727 |
| 5,291,788 | * 3/1994 | Oohata et al. | 73/726 |
| 5,412,993 | * 5/1995 | Ohtani | 72/727 |

* cited by examiner

Primary Examiner—Robert Raevis
(74) Attorney, Agent, or Firm—Michael J. Striker

(57) ABSTRACT

A sensor is proposed that has a measuring diaphragm (2), with at least one resistor measurement bridge (7, 8); a deflection of the measuring diaphragm (2) causes mistuning of the respective measurement bridge (7, 8), and the resultant change in the bridge diagonal voltage can be evaluated. The sensor (1) has one resistor measurement bridge (7, 8) on each half (3, 4) of the measuring diaphragm (2), and in each of the resistor measurement bridges (7, 8), two opposed bridge branches (R1, R4) are changed in their resistance values (ΔR) by radial compressive offset, and the respectively other bridge branches (R2, R3) are altered in their resistances by radial or tangential elongation.

5 Claims, 2 Drawing Sheets

TESTABLE MEMBRANE SENSOR WITH TWO FULL BRIDGES

BACKGROUND OF THE INVENTION

The invention relates to a sensor, especially a pressure sensor.

By way of example, pressure sensors are known in which thin-film resistor measurement bridges for measuring absolute pressures or pressure changes, particularly in hydraulic systems, are disposed on a measurement diaphragm. Motions of the measurement diaphragm from pressure fluctuations lead to changes of resistance, because of compressive offsets or elongations of what as a rule are meandering resistor tracks, in the various thin-film resistors. The thin-film resistors are connected in a known manner to form a Wheatstone measurement bridge; the association of the thin-film resistors with the bridge branches or the regions on the pressure sensor diaphragm is selected such that the opposed resistors each vary in the same direction, and a bridge diagonal voltage can be measured as a sensor signal.

In the most frequent instances of applications of pressure sensors, such as in hydraulic brake systems in motor vehicles, an accurate output signal corresponding to the pressure of the brake hydraulics (measurement range approximately 250 bar) must be generatable highly reliably and in addition in as fail-safe a way as possible. Especially in systems critical to safety in the area of brake systems, such as the anti-lock system or traction control system, sensors are required, the perfect function of which must also be monitorable continuously. Other applications include monitoring functions in pneumatic systems and in injection systems for delivering fuel in motor vehicles.

It is also known that the monitoring of pressure sensors that have resistor measurement bridges is done in such a way that at specified time intervals an absolute measurement of the individual resistors is done, in order to detect changes, caused for instance by aging or destruction (for instance from corrosion or breakage) of the resistor properties of the individual thin-film resistors. Plastic deformations of the pressure measuring diaphragm from overpressure or tearing of the most severely strained point in the middle of the diaphragm cause incorrect measurements. A change in resistors that vary in the same direction in the bridge branches cannot be detected, without the special provisions already mentioned, since these changes compensate for one another by offset in the measurement bridge, and thus while the measurement bridge appears unchanged from outside, nevertheless its sensitivity changes and thus mistakes.

The resistors of the measurement bridge that each change in the same direction are located on the pressure measuring diaphragm preferentially at locations having the same mechanical properties with respect to tensile elongation or compressive offset (either in the middle or on the edge of the pressure measuring diaphragm) and are therefore under equal strain; their deviations behave accordingly. Plastic deformations of the pressure measuring diaphragm thus also exhibit the same undetectable signal errors. Another known possibility of detecting such errors is to repeat the comparison of the individual resistors with a stable reference resistor at certain intervals. The reference resistor, which is stable over its entire life, can be connected parallel to a bridge resistor for this purpose and therefore used for monitoring changes in the bridge output signal.

The known sensors with the special monitoring mechanisms discussed have the disadvantage above all that a constant switchover is necessary between the test/monitoring mode and pressure sensing, which greatly reduces the dynamics of the sensor since the reference measurement takes time. Moreover, demands for failsafeness and redundancy cannot be met by these provisions.

SUMMARY OF THE INVENTION

Accordingly, it is an object of present invention to provides a sensor which avoids the disadvantages of the prior art.

In keeping with these objects, one feature of present invention resides in a sensor in which in a first resistor measurement bridge all four bridge branches are acted upon by radially acting mechanical tensions on the measuring diaphragm and these bridge branches stretched by radial elongation being located in the center of the measuring diaphragm, and in the second resistor measurement bridge unlike the first, the bridge branches that are acted upon by a tangential elongation are located in a peripheral region of the measuring diaphragm and are oriented such that tangential mechanical tensions act upon them.

The sensor according to the invention is advantageous, in particular because as a result of disposition of two mutually independent resistor measurement bridges each on one half of the diaphragm, monitoring of the functionality of the sensor can be done during operation without special reference measurements. The availability of the sensor is increased as well, since even if one resistor measurement bridge fails, emergency operation of the system with the other measurement bridge is assured.

In a preferred embodiment of the sensor of the invention, the thin-film resistors of at least one of the two resistor measurement bridges are arranged on the measuring diaphragm in such a way that radial elongations/compressiive offsets of the measuring diaphragm cause an increase or decrease in resistance. For the other resistor measurement bridge in each case, the thin-film resistors opposite one another in the bridge are arranged on the measuring diaphragm in such a way that a tangential extension is preferentially detected in the peripheral region of the diaphragm and causes an increase in resistance. By utilizing the tangential effect, these resistors are less severely strained, and the deviation over their lifetime is thus also lower.

Since the two measurement bridges of the embodiment described above behave differently with respect to the bridge diagonal signal over their lifetime, since the thin-film resistors for detecting the tangential elongation detect a different diaphragm motion from the radial elongation or compressive offset, a simple functional monitoring can be done by comparing the two bridge signals. Plastic deformations of the pressure measuring diaphragm can also be detected unequivocally in the bridge offset in this way, since the two bridge diagonal signals drift markedly apart as a result. Aging phenomena and mechanical or physical-chemical effects influence the sensitivity of the two bridges differently, so that the sensitivity can be detected by means of a comparison.

BRIEF DESCRIPTION OF THE DRAWINGS

One exemplary embodiment of the sensor of the invention will be explained in conjunction with the drawing. Shown are.

DESCRIPTION OF THE PREFERRED EMBODIMENT

Figure 1:
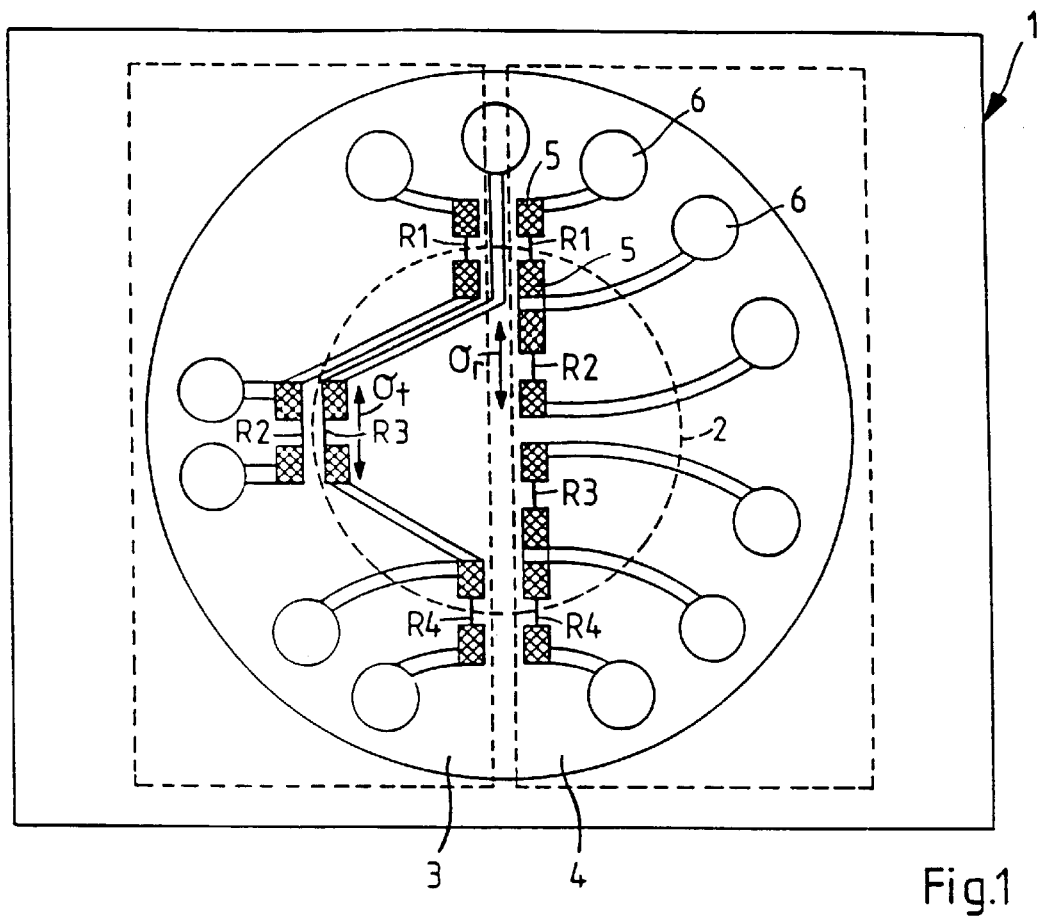
FIG. 1, a plan view on a measuring diaphragm of a pressure sensor.

In FIG. 1, a sensor 1 is shown that serves as a pressure sensor for detecting pressure conditions in the brake hydraulics of a motor vehicle. The sensor 1 includes a measuring diaphragm 2 (for instance of metal), on which thin-film resistors R1, R2, R3 and R4 (for instance of polycrystalline silicon) are applied to each of two sensor halves 3 and 4. The thin-film resistors R1–R4 are contacted on the measuring diaphragm 2 at points 5, and for purposes of external connection, the points 5 are each extended to contact pads 6. For the sake of simplicity, this is shown in FIG. 1 only for the resistor R1 on the right-hand sensor half 4, as an example.

Figures 2, 3:
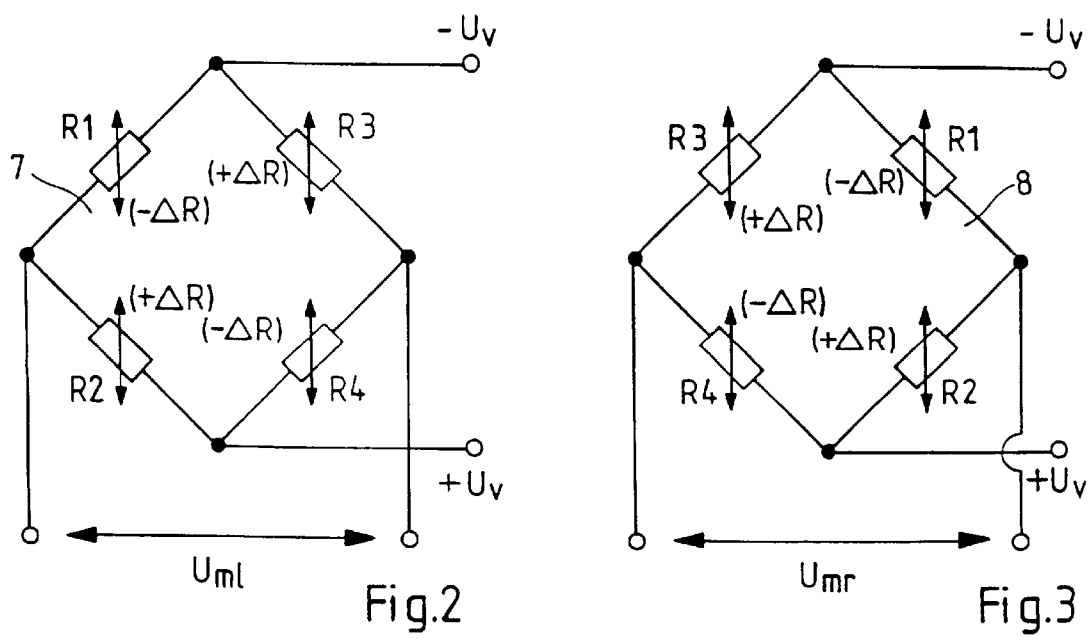
FIG. 2, an electrical circuit diagram for the right-hand measurement bridge.
FIG. 3, an electrical circuit diagram for the left-hand measurement bridge.

FIG. 2 and FIG. 3 show the electrical substitute circuit diagrams for the resistors R1–R4 on sensor half 3 (FIG. 2) and sensor half 4 (FIG. 3) each of which forms a respective Wheatstone measurement bridge 7 and 8. For evaluation as a sensor output signal, the bridge diagonal voltages Uml (FIG. 2) and Umr (FIG. 3) are available.

Figure 4:
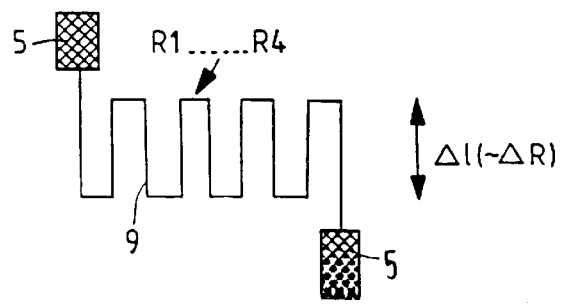
FIG. 4, a detail view of a thin-film resistor.

One exemplary embodiment of one of the thin-film resistors R1–R4 is shown in FIG. 4, in which the meandering structure of resistor tracks 9 between the points 5 can be seen. The resistors R1–R4 here undergo a change in their resistance (+ΔR) on an elongation (+Δl) in the direction indicated. In the case of resistors made of other materials, a geometrical structure may be chosen in order to attain the same measurement effect.

Figure 5:
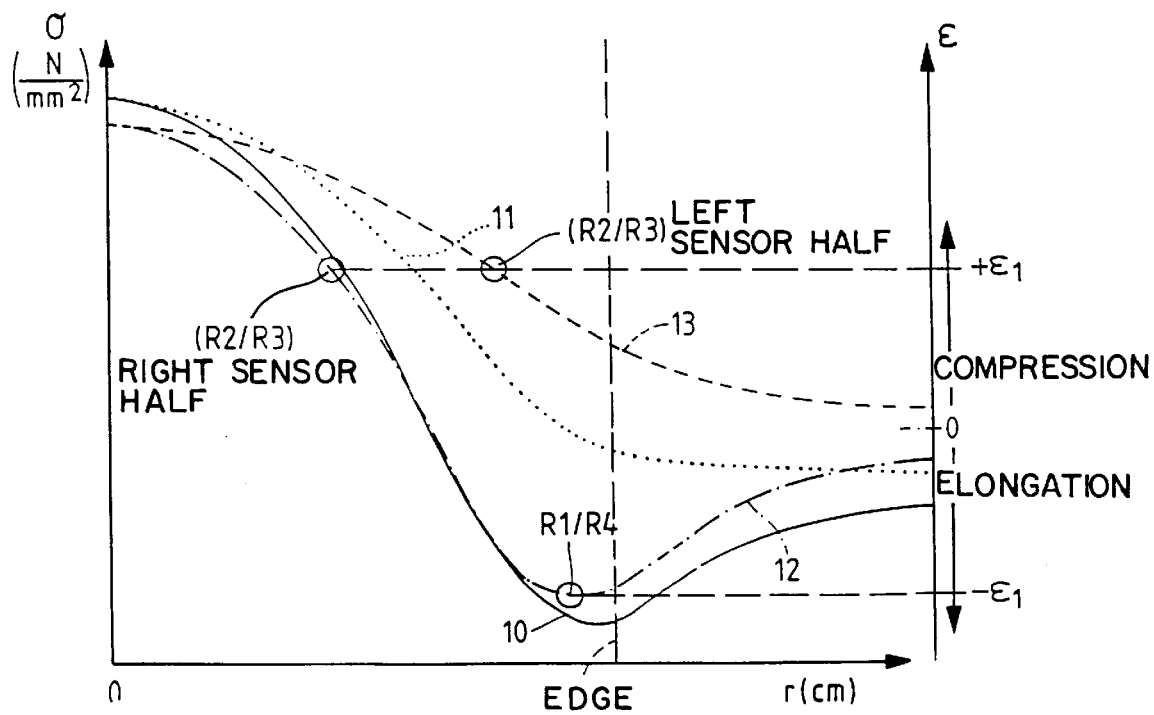
FIG. 5, a graph showing the mechanical tension/elongations on the measuring diaphragm.

In FIG. 5, a graph of the courses of the mechanical tensions σ and the resultant elongations or compressive offsets ε in radially different regions of the measuring diaphragm 2 is shown. An explanation of this graph will be made in conjunction with the description of the exemplary embodiment, in particular with reference to FIGS. 1–3.

The bridge resistors R1 and R4 of the right sensor half 4 (see FIGS. 1 and 3) are located in the peripheral region of the measuring diaphragm 2 in the vicinity of the mechanical fastening, and the bridge resistors R2 and R3 are located in the center of the measuring diaphragm 2. Upon a deflection or bulging of the measuring diaphragm 2 from an increase in pressure, the bridge resistors R2 and R3 in the center of the measuring diaphragm 2 undergo an elongation in the same direction as a result of the radially acting mechanical tension, which leads to an increase in their resistances (+ΔR). In the case of the bridge resistors R1 and R4 in the peripheral region, a compressive offset occurs from the bulging in the same direction in the fastening region of the measuring diaphragm 2. Again because of the radially acting mechanical strain, this causes a reduction in the resistances (−ΔR) of the bridge resistors R1 and R4. The resultant mistuning of the measurement bridge 8 can be evaluated via the altered bridge diagonal voltage Umr.

In the left sensor half 3, the bridge resistors R1 and R4 (see FIGS. 1 and 2) are arranged identically to the corresponding bridge resistors R1 and R4 in the right sensor half 4 and therefore undergo the same resistance changes as well. To achieve the advantageous properties discussed in the introduction to the specification, however, the bridge resistors R2 and R3 of the measurement bridge 7 are likewise disposed in the peripheral region of the pressure measuring diaphragm 2, specifically in such a way that a tangential elongation effect of the diaphragm surface caused by the mechanical tension is evaluated. The meandering resistor tracks 9 of the resistors R2 and R3 do undergo an increase in resistance (+ΔR) from elongation here, but the mechanical interactions between a pressure change (+Δp) and the mistuning of the bridge diagonal voltage Uml are different from the interactions on the right sensor half 4.

Because of the different evaluations of a pressure change (Δp) in the two sensor halves 3 and 4, many errors in the sensor 1 (for instance from aging, corrosion or membrane breakage), that otherwise cause changes in the same direction in the bridge resistors and are thus compensated for in the bridge offset, can thus be detected. The bridge resistors R2 and R3 of the left measurement bridge 7 are also located in a mechanically relatively little stressed region of the measuring diaphragm 2, so that the reliability of the left-hand measurement bridge 7 is very high, and thus the emergency operation properties of the sensor 1 are improved.

The graph of FIG. 5 schematically shows some typical courses of the mechanical tension σ over the radius r of the measuring diaphragm 2 and the resultant elongations/compressive offsets ε at the bridge resistors R1–R4. The course of the radially acting tension σr is shown in curve 10, and the course of the tangentially acting tension σt is shown in curve 11. Curve 12 shows the course of the radial elongation εr, and curve 13 shows the course of the tangential elongation εt with respect to the right-hand vertical coordinate axis.

From curve 12 in FIG. 5, the transition from the pronounced elongation at the center of the measuring diaphragm 2 (r=0) to the compressive offset in the peripheral region, caused by the radial tension εr (curve 10) which results from a pressure increase Δp, can clearly be seen. The tangential tension σt (curve 11) and the resultant elongation εt, conversely, have a markedly flatter course and therefore have a different dependency on the pressure change Δp. In order nevertheless to attain merely equal measurement ranges in the normal evaluation of the bridge diagonal voltages, the bridge resistors R2 and R3 of the left sensor half 3 can be shifted to a region of the measuring diaphragm 2 in which a comparable elongation to the bridge resistors R2 and R3 of the right sensor half 4 is detected. The most favorable possibilities for locating the bridge branches are represented in the graph of FIG. 5 by small circles, which are located approximately symmetrically (+ε1; −ε1) to the zero point of the elongation-compressive offset axis ε.

What is claimed is:

1. A sensor, comprising a measuring diaphragm; and a resistor measurement bridge means arranged on said measuring diaphragm so that a deflection of said measuring diaphragm causes mis tuning of said measuring bridge means and a resulting change in a bridge diagonal voltage is evaluatable, said resistor measurement bridge means including a first resistor measurement bridge and a second resistor measurement bridge each arranged on each half of said measuring diaphragm, said first resistor measurement bridge having all four bridge branches which are acted upon by radially acting mechanical tensions on said measuring diaphragm and said bridge branches stressed by radial elongation being located in a center of said measuring diaphragm, said second resistor measurement bridge unlike said first resistor measurement bridge having bridge branches that are acted upon by a tangential elongation and located in a peripheral region of said measuring diaphragm and oriented such that tangential mechanical tensions act upon them.

2. A sensor as defined in claim 1, wherein said bridge branches have resistors which are formed as thin-film resistors with meandering resistor tracks which during an extension between connecting points undergo a resistance increase and during a compression undergo a resistance decrease.

3. A sensor as defined in claim 2, wherein said thin-film resistors are composed of polycrystalyne silicone.

4. A sensor as defined in claim 2, wherein said bridge branches of said second resistor measurement bridge upon which tangential elongation acts and said bridge branches of said first resistor measurement bridge upon which radially acting mechanical tensions act are arranged in a region between a center and an edge of said measuring diaphragm, so that during disturbance free operation of the sensor a relative sensitivity with regard to mechanical tensions on said measuring diaphragm is provided.

5. A sensor as defined in claim 1, wherein said sensor is formed as a pressure sensor for monitoring pressure conditions in hydraulic and/or pneumatic systems in a motor vehicle.

* * * * *